United States Patent
Mukesh et al.

(10) Patent No.: US 11,094,590 B1
(45) Date of Patent: Aug. 17, 2021

(54) STRUCTURALLY STABLE SELF-ALIGNED SUBTRACTIVE VIAS

(71) Applicant: International Business Machines Corporation, Armonk, NY (US)

(72) Inventors: Sagarika Mukesh, Albany, NY (US); Dominik Metzler, Clifton Park, NY (US); Chanro Park, Clifton Park, NY (US); Timothy Mathew Philip, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/813,682

(22) Filed: Mar. 9, 2020

(51) Int. Cl.
*H01L 21/768* (2006.01)
*H01L 23/522* (2006.01)
*H01L 21/3213* (2006.01)

(52) U.S. Cl.
CPC .. *H01L 21/76897* (2013.01); *H01L 21/32139* (2013.01); *H01L 21/76885* (2013.01); *H01L 23/5226* (2013.01)

(58) Field of Classification Search
CPC ......... H01L 21/76897; H01L 21/76885; H01L 21/32139; H01L 23/5226
See application file for complete search history.

(56) References Cited

U.S. PATENT DOCUMENTS

| | | | |
|---|---|---|---|
| 8,357,609 B2 | 1/2013 | Ryan | |
| 8,367,544 B2 | 2/2013 | Cheng et al. | |
| 8,633,117 B1 | 1/2014 | Cabral et al. | |
| 9,318,330 B2 | 4/2016 | Tagami et al. | |
| 9,548,269 B2 | 1/2017 | Myers et al. | |
| 9,601,426 B1 | 3/2017 | Bonilla et al. | |
| 9,761,489 B2 | 9/2017 | Mebarki et al. | |
| 9,793,163 B2 | 10/2017 | Bristol et al. | |
| 10,269,623 B2 * | 4/2019 | Bristol | H01L 21/02304 |
| 2019/0146335 A1 | 5/2019 | Blackwell et al. | |
| 2020/0066629 A1 | 2/2020 | Schenker et al. | |

* cited by examiner

*Primary Examiner* — Karen Kusumakar
(74) *Attorney, Agent, or Firm* — Abdy Raissinia; Michael J. Chang, LLC

(57) ABSTRACT

Techniques for forming self-aligned subtractive top vias using a via hardmask supported by scaffolding are provided. In one aspect, a method of forming top vias includes: forming metal lines on a substrate using line hardmasks; patterning vias in the line hardmasks; filling the vias and trenches in between the metal lines with a via hardmask material to form via hardmasks and a scaffolding adjacent to and supporting the via hardmasks; removing the line hardmasks; and recessing the metal lines using the via hardmasks to form the top vias that are self-aligned with the metal lines. The scaffolding can also be placed prior to patterning of the vias in the line hardmasks. A structure formed in accordance with the present techniques containing top vias is also provided.

20 Claims, 8 Drawing Sheets

STRUCTURALLY STABLE SELF-ALIGNED SUBTRACTIVE VIAS

FIELD OF THE INVENTION

The present invention relates to top vias in a back-end-of line (BEOL) interconnect structure, and more particularly, to techniques for forming self-aligned subtractive top vias in a BEOL interconnect structure using a via hardmask supported by scaffolding for structural stability.

BACKGROUND OF THE INVENTION

A subtractive etch process can be employed to form vias over metal lines (also referred to herein as "top vias") in a back-end-of line (BEOL) interconnect structure. To do so, tall metal lines are formed and via hardmasks are placed over the metal lines. The via hardmasks are then used to recess the tall metal lines to form the top vias. Advantageously, this subtractive etching process permits the formation of structures without any interface between the metal lines and the top vias.

There are, however, some notable challenges associated with this process. For instance, the via hardmasks are both tall and narrow and thus tend to fall over due to a lack of structural stability. Such a collapse of the via hardmask can lead to unwanted defects in the final pattern such as missing vias, unwanted vias, or pattern collapse as well as high defectivity.

Accordingly, techniques for forming self-aligned subtractive vias that are structurally stable would be desirable.

SUMMARY OF THE INVENTION

The present invention provides techniques for forming self-aligned subtractive top vias using a via hardmask supported by scaffolding for structural stability. In one aspect of the invention, a method of forming top vias is provided. The method includes: forming metal lines on a substrate using line hardmasks; patterning vias in the line hardmasks; filling the vias and trenches in between the metal lines with a via hardmask material, wherein the via hardmask material filling the vias forms via hardmasks, and wherein the via hardmask material filling the trenches in between the metal lines forms a scaffolding adjacent to and supporting the via hardmasks; removing the line hardmasks; and recessing the metal lines using the via hardmasks to form the top vias that are self-aligned with the metal lines.

In another aspect of the invention, another method of forming top vias is provided. The method includes: forming metal lines on a substrate using line hardmasks; filling trenches in between the metal lines with a via hardmask material; patterning vias in the line hardmasks; filling the vias with the via hardmask material, wherein the via hardmask material filling the vias forms via hardmasks, and wherein the via hardmask material filling the trenches in between the metal lines forms a scaffolding adjacent to and supporting the via hardmasks; removing the line hardmasks; and recessing the metal lines using the via hardmasks to form the top vias that are self-aligned with the metal lines.

In yet another aspect of the invention, a structure is provided. The structure includes: metal lines formed on a substrate; top vias self-aligned with the metal lines; via hardmasks disposed on the top vias; and a scaffolding, disposed in trenches between the metal lines, adjacent to and supporting the via hardmasks.

A more complete understanding of the present invention, as well as further features and advantages of the present invention, will be obtained by reference to the following detailed description and drawings.

DETAILED DESCRIPTION OF PREFERRED EMBODIMENTS

Figure 1:
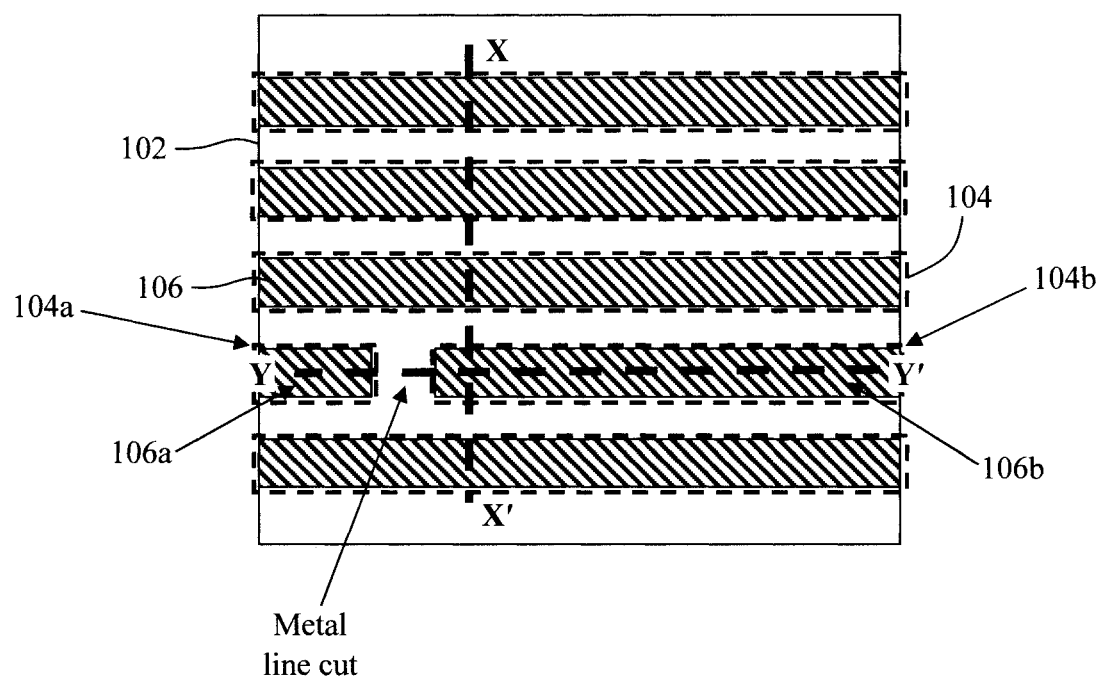
FIG. 1 is a top-down diagram illustrating metal lines having been formed on a substrate using line hardmasks and at least one of the metal lines having been cut into multiple segments with a line cut trench in between the segments according to an embodiment of the present invention.

Provided herein are techniques for forming self-aligned subtractive top vias in a back-end-of line (BEOL) interconnect structure. Advantageously, instead of having unstable via plug hardmasks as in conventional flows, the present techniques involve placing an excess of the via plug hardmask material such that the via plug hardmask material acts as both a hardmask for recessing the metal lines to form the top vias and as scaffolding for the overall structure. As such, the problems associated with collapse of the via hardmasks such as missing vias, unwanted vias and/or pattern collapse can be avoided. As will be described in detail below, this scaffolding can be placed either after patterning of the top vias in the line hardmask (see FIGS. 1-10) or before patterning of the top vias in the line hardmask (see FIGS. 11-19).

A first exemplary embodiment for forming top vias in a BEOL interconnect structure is now described by way of reference to FIGS. 1-10. The following description will reference both top-down views of the structure at various stages of the process as well as cross-sectional cuts through the structure. Namely, referring to FIG. 1 (a top-down view) the process begins with the formation of a plurality of metal lines 106 on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

Standard lithography and etching techniques can be employed to form the metal lines 106 on substrate 102. For instance, a metal layer is first deposited onto the substrate 102. By way of example only, suitable metals for the metal layer include, but are not limited to, cobalt (Co), ruthenium (Ru) and/or tungsten (W). A process such as evaporation, sputtering, or electrochemical plating can be employed to deposit the metal layer onto the substrate 102.

Line hardmasks 104 are then formed on the metal layer marking the footprint and location of the metal lines 106. It is notable that in the top-down depiction provided in FIG. 1, dashed lines are used to represent the outline of the line hardmasks 104 in order to show the underlying metal lines 106. Depictions of the line hardmasks 104 over the metal lines 106 are also provided in the cross-sectional views described below. Suitable materials for the line hardmasks 104 include, but are not limited to, nitride hardmask materials such as silicon nitride (SiN), silicon oxynitride (SiON), silicon carbide nitride (SiCN), and/or oxide hardmask materials such as silicon oxide (SiOx). Line hardmasks 104 can be formed using a patterning technique such as lithography followed by an etching process. Suitable etching processes include, but are not limited to, a directional (anisotropic) etching process such as reactive ion etching (ME). Alternatively, the line hardmasks 104 can be formed by other suitable techniques, including but not limited to, sidewall image transfer (SIT), self-aligned double patterning (SADP), self-aligned quadruple patterning (SAQP), and other self-aligned multiple patterning (SAMP).

The pattern from the line hardmasks 104 is then transferred to the underlying metal layer to form the metal lines 106. A directional (anisotropic) etching process such as ME can be employed for the metal line etch. As shown in FIG. 1, at least one of the metal lines 106 is cut into multiple segments, e.g., segments 106a and 106b. Advantageously, as will be described in detail below, the present process can be employed to form top vias self-aligned to the end of one or more of these metal line segments. To form this cut in the metal line, the corresponding line hardmask 104 is cut into multiple segments, e.g., segments 104a and 104b, prior to patterning of the metal layer. See FIG. 1. Thus, when the pattern is transferred from the line hardmasks 104 to the metal layer, the cut between segments 104a and 104b will be transferred to the underlying metal line, forming segments 106a and 106b.

Figure 2A:
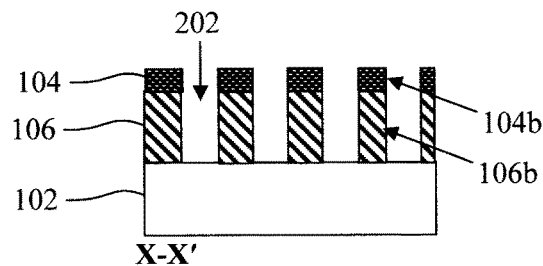
FIG. 2A is a cross-sectional diagram, perpendicular to the metal lines, illustrating the metal lines having been formed on the substrate using the line hardmasks.
Figure 2B:
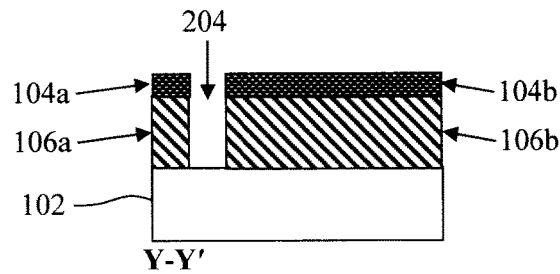
FIG. 2B is a cross-sectional diagram, through one of the metal lines, illustrating at least one of the metal lines having been cut into multiple segments with a line cut trench in between the segments according to an embodiment of the present invention.

As shown in FIG. 1, different cross-sectional views of the interconnect structure will be provided in the figures that follow. One cross-sectional cut (X-X') will be perpendicular to the metal lines 106, and another cross-sectional cut (Y-Y') will be parallel to the metal lines 106, through a given one of the metal lines 106 (in this case the metal line 106 that has been cut into segments 106a and 106b). For instance, FIG. 2A (a cross-sectional cut X-X') illustrates line hardmasks 104 having been used to pattern metal lines 106 on the substrate 102. The patterning of metal lines 106 forms trenches 202 in between the metal lines 106. As shown in FIG. 2B (a cross-sectional cut Y-Y'), at least one of the line hardmasks 104 is cut into multiple segments 104a and 104b. Thus, when the pattern from the line hardmasks 104 is transferred to the metal lines 106, at least one of the metal lines 106 will be cut into multiple segments 106a and 106b. This process forms line cut trench 204 in between segments 106a and 106b of the at least one cut metal line 106.

Figure 3A:
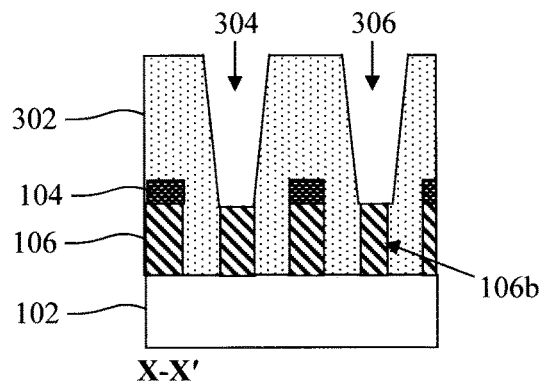
FIG. 3A is a cross-sectional diagram, perpendicular to the metal lines, illustrating an organic planarizing layer (OPL) having been deposited onto the line hardmasks and metal lines, filling trenches in between the metal lines, and vias having been patterned in the OPL and in the line hardmasks over the metal lines/metal line segment.
Figure 3B:
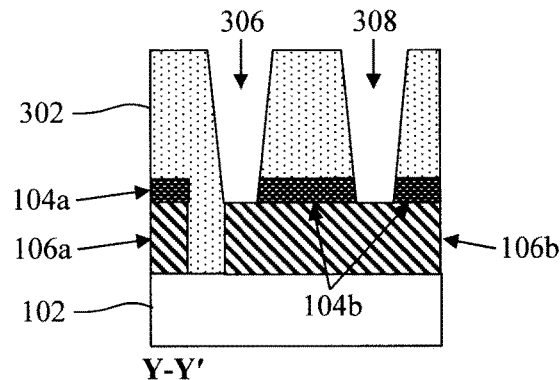
FIG. 3B is a cross-sectional diagram, through one of the metal lines, illustrating the OPL having been deposited onto the line hardmasks and metal lines, filling the line cut trench in between the segments, and the vias having been patterned in the OPL and in the line hardmasks over the metal lines/metal line segment according to an embodiment of the present invention.

As shown in FIG. 3A (a cross-sectional cut X-X') and FIG. 3B (a cross-sectional cut Y-Y'), an organic planarizing layer (OPL) 302 is then deposited onto the line hardmasks 104 and metal lines 106, filling the trenches 202 in between the metal lines 106 and the line cut trench 204 in between segments 106a and 106b of the at least one cut metal line 106. A casting process such as spin coating or spray coating can be employed to deposit the OPL 302. Following deposition, the OPL 302 can be planarized using a process such as chemical-mechanical polishing (CMP).

Standard lithography and etching techniques are the used to pattern vias 304, 306 and 308 in the OPL 302 and in the line hardmasks 104 over the metal lines 106/metal line segment 106a. A directional (anisotropic) etching process such as RIE can be used for the via etch. Namely, as shown in FIG. 3A via 304 extends through OPL 302 and the line hardmask 104 over a given one of the metal lines 106, and via 306 extends through the OPL 302 and line hardmask segment 104b over metal line segment 106b. As shown in FIG. 3B, via 308 is adjacent to a side of via 306 opposite the line cut trench 204, and extends through the OPL 302 and the line hardmask segment 104b over the metal line segment 106b.

Following patterning of vias 304, 306 and 308, the OPL 302 is removed. The OPL 302 can be removed using a process such as ashing. Removal of the OPL 302 reopens the trenches 202 in between the metal lines 106, and the line cut trench 204 in between segments 106a and 106b of the at least one cut metal line 106.

Figure 4A:
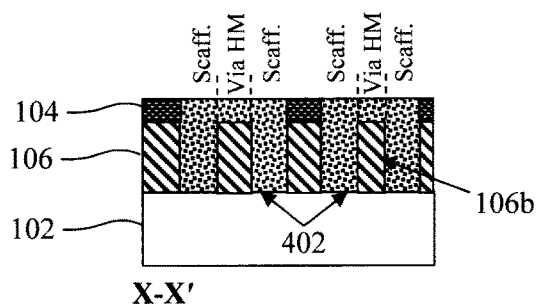
FIG. 4A is a cross-sectional diagram, perpendicular to the metal lines, illustrating the vias and the trenches in between the metal lines having been filled with a via hardmask material to form via hardmasks and a scaffolding.
Figure 4B:
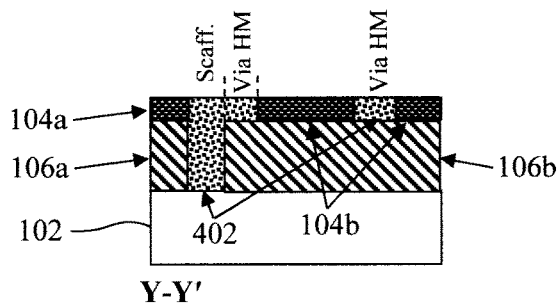
FIG. 4B is a cross-sectional diagram, through one of the metal lines, illustrating the vias and the line cut trench in between the segments having been filled with the via hardmask material to form the via hardmasks and the scaffolding according to an embodiment of the present invention.

As shown in FIG. 4A (a cross-sectional cut X-X') and FIG. 4B (a cross-sectional cut Y-Y'), the vias 304, 306 and 308, the trenches 202 in between the metal lines 106, and the line cut trench 204 in between segments 106a and 106b of the at least one cut metal line 106 are then filled with a via hardmask material 402. Suitable via hardmask materials 402 include, but are not limited to, oxide hardmask materials such as SiOx and/or spin-on-glass (SOG). A process such as chemical vapor deposition (CVD), atomic layer deposition (ALD), physical vapor deposition (PVD), spin-coating and/or spray coating can be employed to deposit the via hardmask material 402. Following deposition, the via hardmask materials 402 can be planarized using a process such as CMP.

Specifically, as shown in FIG. 4A the via hardmask material 402 is deposited into the trenches 202 in between the metal lines 106, and into the vias 304 and 306. The via hardmask material 402 deposited into the vias 304 and 306 is present over the metal lines 106/metal line segment 106b and will serve as the via hardmasks (via HM) for recessing the metal lines 106/metal line segment 106b to form the top vias (see below). The via hardmask material 402 deposited into the trenches 202 in between the metal lines 106 forms the scaffolding (scaff.) adjacent to the via hardmasks. Advantageously, this scaffolding physically supports the via hardmasks and prevents the via hardmasks from collapse.

As shown in FIG. 4B, the via hardmask material 402 is deposited into the line cut trench 204 in between segments 106a and 106b of the at least one cut metal line 106, and into the vias 306 and 308. As above, the via hardmask material 402 deposited into the vias 304 and 306 is present over the metal line segment 106b and will serve as the via hardmasks for forming the top vias (see below), whereas the via hardmask material 402 deposited into the line cut trench 204 forms the scaffolding adjacent to, and supporting the via hardmasks.

Figure 5:
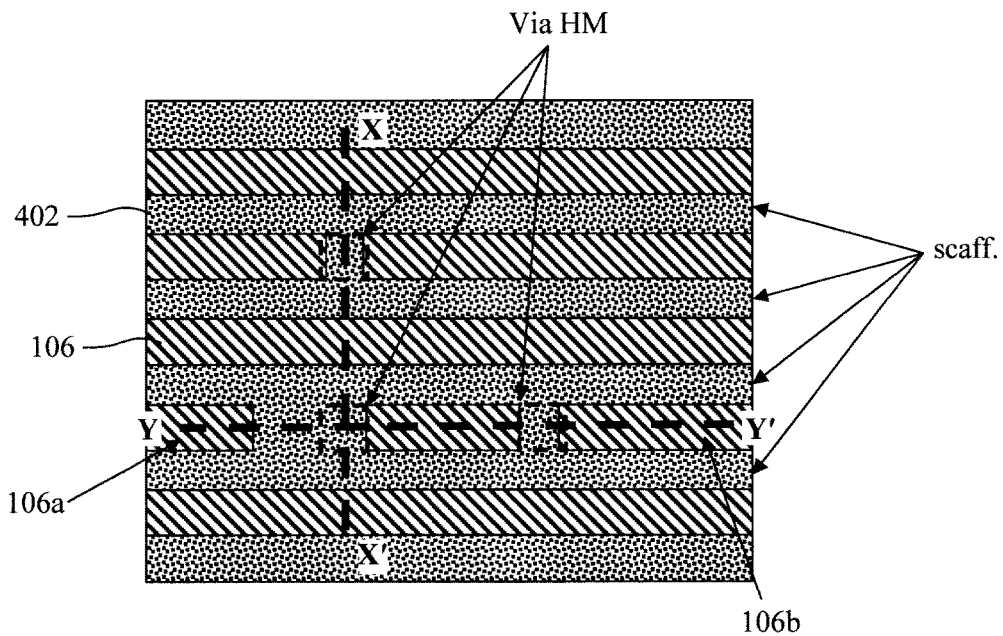
FIG. 5 is a top-down diagram illustrating the line hardmasks having been selectively removed according to an embodiment of the present invention.

The line hardmasks 104/line hardmask segments 104a and 104b are then removed selective to the via hardmask material 402. See FIG. 5 (a top-down view). According to an exemplary embodiment, the line hardmasks 104/line hardmask segments 104a and 104b are selectively removed using a non-directional (isotropic) etching process such as a wet chemical etch. As shown in FIG. 5, the via hardmasks are supported on at least two sides by the adjacent scaffolding. As described above, the via hardmasks and scaffolding are both formed from via hardmask material 402.

Figure 6A:
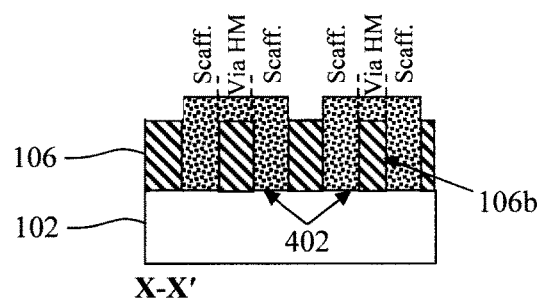
FIG. 6A is a cross-sectional diagram, perpendicular to the metal lines, illustrating the line hardmasks having been selectively removed.
Figure 6B:
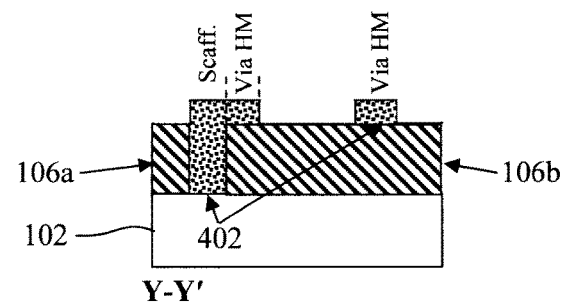
FIG. 6B is a cross-sectional diagram, through one of the metal lines, illustrating the line hardmasks having been selectively removed according to an embodiment of the present invention.

FIG. 6A (a cross-sectional cut X-X') and FIG. 6B (a cross-sectional cut Y-Y') illustrate the line hardmasks 104/line hardmask segments 104a and 104b having been selectively removed. As shown in FIG. 6A and FIG. 6B, the via hardmasks over the metal lines 106/metal line segment 106*b* are supported on at least two sides by the adjacent scaffolding. Both the via hardmasks and scaffolding are formed from via hardmask material 402.

Figure 7A:
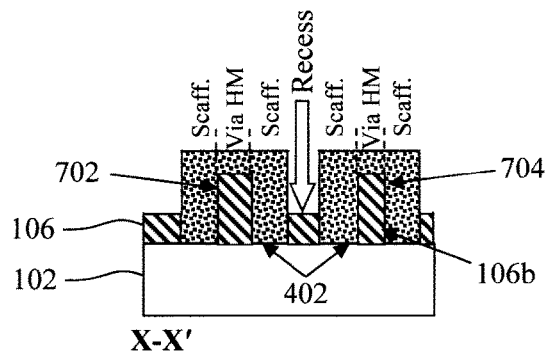
FIG. 7A is a cross-sectional diagram, perpendicular to the metal lines, illustrating an etch having been employed to recess the metal lines/metal line segments using the via hardmasks to form subtractive top vias self-aligned with the metal lines/metal line segments.
Figure 7B:
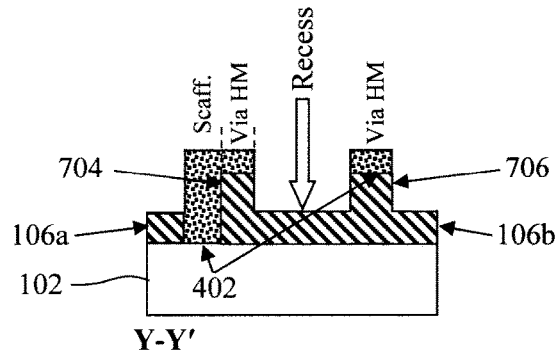
FIG. 7B is a cross-sectional diagram, through one of the metal lines, illustrating the etch having been employed to recess the metal lines/metal line segments using the via hardmasks to form subtractive top vias self-aligned with the metal lines/metal line segments according to an embodiment of the present invention.

With the via hardmasks (and supporting scaffolding) in place marking the footprint and location of the top vias, an etch is then employed to recess the metal lines 106/metal line segments 106*a* and 106*b*. See FIG. 7A (a cross-sectional cut X-X') and FIG. 7B (a cross-sectional cut Y-Y'). As shown in FIG. 7A and FIG. 7B, this recess etch forms subtractive top vias 702, 704 and 706 in metal lines 106/metal line segment 106*b*.

Figure 8:
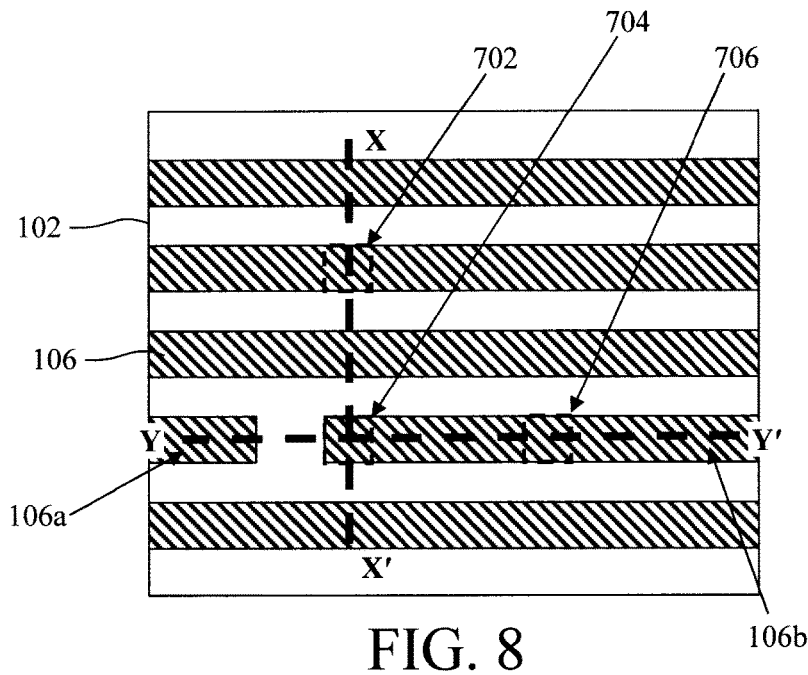
FIG. 8 is a top-down diagram illustrating the via hardmasks and scaffolding having been removed according to an embodiment of the present invention.

Following formation of top vias 702, 704 and 706 in metal lines 106/metal line segment 106*b*, the via hardmasks and scaffolding (i.e., via hardmask material 402) is then removed. See FIG. 8 (a top-down view). According to an exemplary embodiment, the via hardmask material 402 is removed using a non-directional (isotropic) etching process such as a wet chemical etch. As shown in FIG. 8, top vias 702, 704 and 706 are now present over select metal lines 106. Notably, by way of the present process, the top vias 702, 704 and 706 are self-aligned with the underlying metal lines 106, including top via 704 that is self-aligned with the end of metal line segment 106*b*.

Figure 9A:
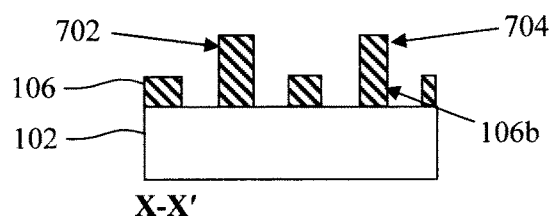
FIG. 9A is a cross-sectional diagram, perpendicular to the metal lines, illustrating the via hardmasks and scaffolding having been removed.
Figure 9B:
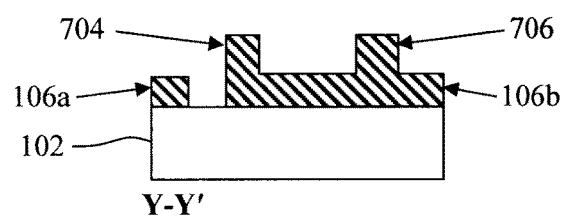
FIG. 9B is a cross-sectional diagram, through one of the metal lines, illustrating the via hardmasks and scaffolding having been removed according to an embodiment of the present invention.

FIG. 9A (a cross-sectional cut X-X') and FIG. 9B (a cross-sectional cut Y-Y') illustrate the via hardmasks and scaffolding (i.e., via hardmask material 402) having been selectively removed. As shown in FIG. 9A and FIG. 9B, the top vias 702, 704 and 706 formed by the present process are self-aligned with the underlying metal lines 106, including top via 704 that is self-aligned with the end of metal line segment 106*b*.

Figure 10A:
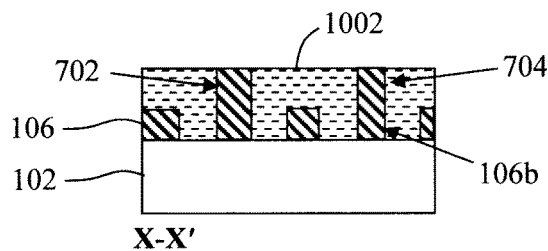
FIG. 10A is a cross-sectional diagram, perpendicular to the metal lines, illustrating the top vias and metal lines/metal line segments having been buried in an interlayer dielectric (ILD) which is then polished down to (and exposing) the tops of the top vias.
Figure 10B:
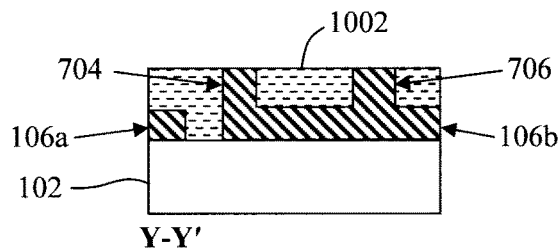
FIG. 10B is a cross-sectional diagram, through one of the metal lines, illustrating the top vias and metal lines/metal line segments having been buried in the ILD which is then polished down to (and exposing) the tops of the top vias according to an embodiment of the present invention.

Following removal of the via hardmasks and scaffolding, the top vias 702, 704 and 706, and metal lines 106/metal line segments 106*a* and 106*b* then buried in an interlayer dielectric (ILD) 1002. See FIG. 10A (a cross-sectional cut X-X') and FIG. 10B (a cross-sectional cut Y-Y'). Suitable ILD 1002 materials include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD, or PVD can be employed to deposit the ILD 1002 surrounding the top vias 702, 704 and 706, and metal lines 106/metal line segments 106*a* and 106*b*. Following deposition, the ILD 1002 can be polished using a process such as CMP. As shown in FIG. 10A and FIG. 10B, according to an exemplary embodiment, the ILD 1002 is polished down to (and exposing) the tops of the top vias 702, 704 and 706.

As provided above, the scaffolding can also be placed earlier on in the process, such as prior to patterning of the top vias in the line hardmasks. This alternative embodiment is now described by way of reference to FIGS. 11-19. As above, the following description will reference both top-down views of the structure at various stages of the process as well as cross-sectional cuts through the structure. Like structures will be numbered alike in the following description and associated figures.

Figure 11:
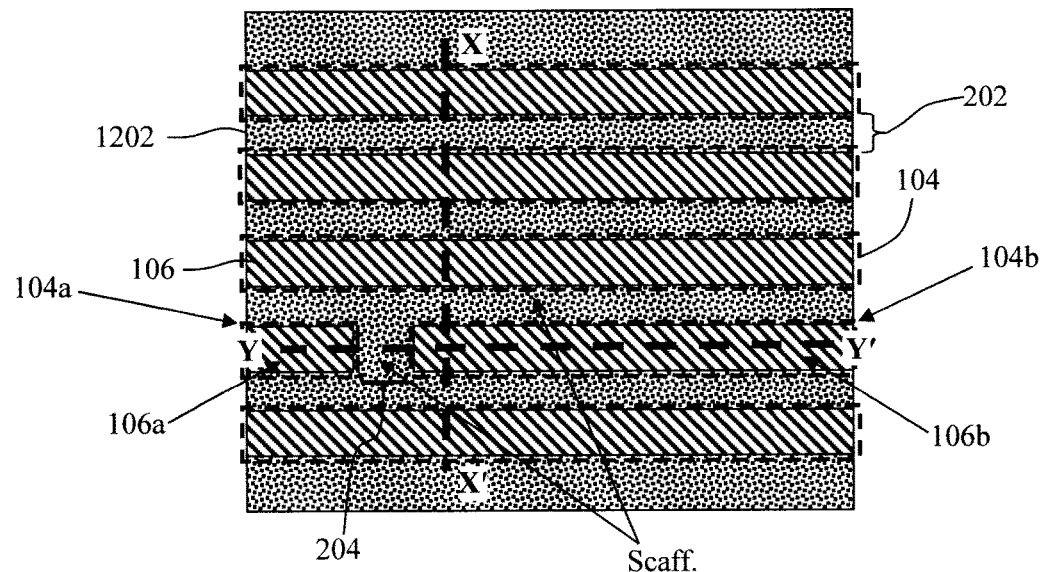
FIG. 11 is a top-down diagram illustrating metal lines having been formed on a substrate using line hardmasks, at least one of the metal lines having been cut into multiple segments with a line cut trench in between the segments, and trenches in between the metal lines having been filled with a via hardmask material to form a scaffolding according to an embodiment of the present invention.

Referring to FIG. 11 (a top-down view) the process begins in the same manner as above with the formation of a plurality of metal lines 106 (e.g., Co, Ru and/or W) on a substrate 102 using line hardmasks 104 (e.g., SiN, SiON, SiCN and/or SiOx—the outlines of which are depicted using dashed lines in order to show the underlying metal lines 106). Suitable substrate 102 configurations were provided above. As shown in FIG. 11, at least one of the line hardmasks 104 and underlying metal lines 106 is cut into multiple segments 104*a*/104*b* and 106*a*/106*b*, respectively, having a line cut trench 204 therebetween.

In contrast to the example above, the trenches 202 in between the metal lines 106 and the line cut trench 204 in between the segments 106*a* and 106*b* of the at least one cut metal line 106 are next filled with the via hardmask material 1202 to form the scaffolding (Scaff.). As provided above, suitable via hardmask materials 1202 include, but are not limited to, SiOx and/or SOG which can be deposited using a process such as CVD, ALD, PVD, spin-coating and/or spray coating. By contrast, in the previous example, the trenches 202 in between the metal lines 106 and the line cut trench 204 in between the segments 106*a* and 106*b* were filled concurrently to form the scaffolding and via hardmasks in the same step.

Figure 12A:
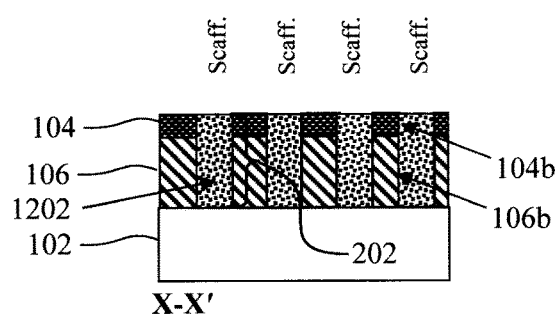
FIG. 12A is a cross-sectional diagram, perpendicular to the metal lines, illustrating the metal lines having been formed on the substrate using the line hardmasks, and the trenches in between the metal lines having been filled with the via hardmask material to form the scaffolding.
Figure 12B:
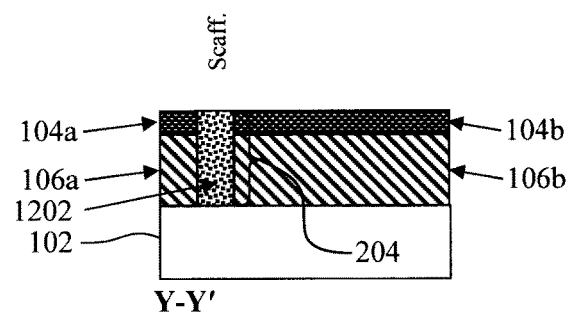
FIG. 12B is a cross-sectional diagram, through one of the metal lines, illustrating the metal lines having been formed on the substrate using the line hardmasks, and the line cut trench in between the segments having been filled with the via hardmask material to form the scaffolding according to an embodiment of the present invention.

This scaffolding-first embodiment is further illustrated in FIG. 12A (a cross-sectional cut X-X') and FIG. 12B (a cross-sectional cut Y-Y'). Namely, FIG. 12A illustrates the line hardmasks 104 having been used to pattern metal lines 106/metal line segments 106*b* on the substrate 102. Trenches 202 present in between the metal lines 106/metal line segments 106*b* are then filled with the via hardmask material 1202, forming the present scaffolding support structure. Following deposition, the via hardmask material 1202 can be planarized using a process such as CMP. Similarly, FIG. 12B illustrates the line hardmasks 104 having been used to pattern metal line segments 106*a* and 106*b* on the substrate 102. The line cut trench 204 present in between metal line segments 106*a* and 106*b* is then filled with the via hardmask material 1202, forming the present scaffolding support structure. Following deposition, the via hardmask material 1202 can be planarized using a process such as CMP.

Figure 13A:
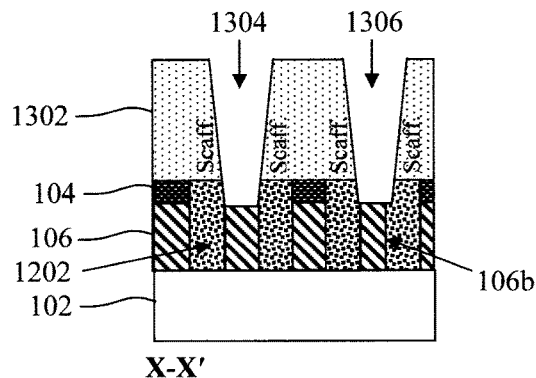
FIG. 13A is a cross-sectional diagram, perpendicular to the metal lines, illustrating an OPL having been deposited onto the line hardmasks and metal lines over the scaffolding, and vias having been patterned in the OPL and in the line hardmasks over the metal lines/metal line segment.
Figure 13B:
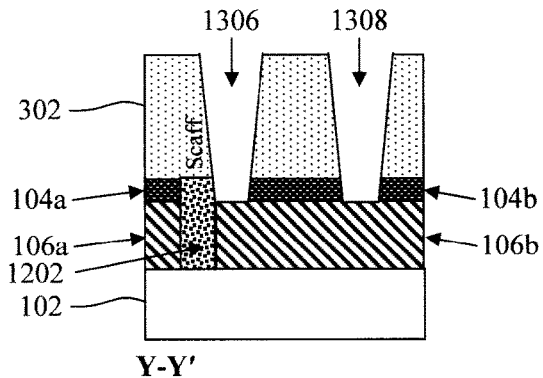
FIG. 13B is a cross-sectional diagram, through one of the metal lines, illustrating the OPL having been deposited onto the line hardmasks and metal lines over the scaffolding, and the vias having been patterned in the OPL and in the line hardmasks over the metal lines/metal line segment according to an embodiment of the present invention.

As shown in FIG. 13A (a cross-sectional cut X-X') and FIG. 13B (a cross-sectional cut Y-Y'), an OPL 1302 is then deposited onto the line hardmasks 104/line hardmask segments 104*a* and 104*b*, and metal lines 106/metal line segments 106*a*/106*b*, over the scaffolding. A casting process such as spin coating or spray coating can be employed to deposit the OPL 1302. Following deposition, the OPL 1302 can be planarized using a process such as CMP.

In the same manner as described above, standard lithography and etching techniques are then used to pattern vias 1304, 1306 and 1308 in the OPL 1302 and line hardmasks 104/line hardmask segment 104*b*. A directional (anisotropic) etching process such as RIE can be used for the via etch. Namely, as shown in FIG. 13A via 1304 extends through OPL 1302 and the line hardmask 104 over a given one of the metal lines 106, and via 1306 extends through the OPL 1302 and line hardmask segment 104*b* over metal line segment 106*b*. As shown in FIG. 13B, via 1308 is adjacent to a side of via 1306 opposite the line cut trench 204, and extends through the OPL 1302 and the line hardmask segment 104*b* over the metal line segment 106*b*. Following patterning of vias 1304, 1306 and 1308, the OPL 1302 is removed. The OPL 1302 can be removed using a process such as ashing.

Figure 14A:
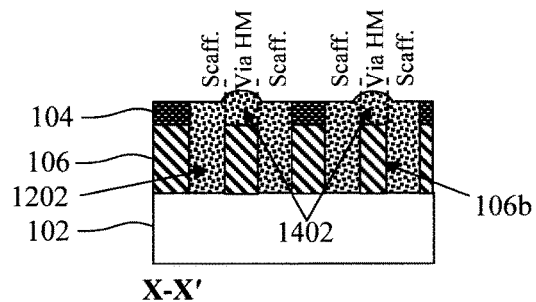
FIG. 14A is a cross-sectional diagram, perpendicular to the metal lines, illustrating the vias having been filled with the via hardmask material to form via hardmasks.
Figure 14B:
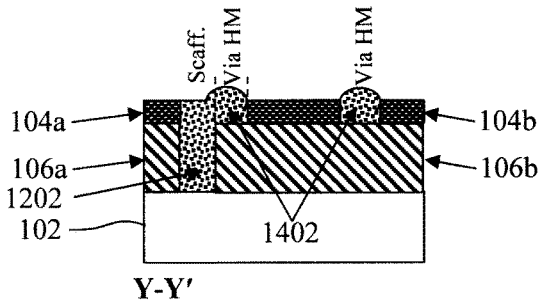
FIG. 14B is a cross-sectional diagram, through one of the metal lines, illustrating the vias having been filled with the via hardmask material to form the via hardmasks according to an embodiment of the present invention.

As shown in FIG. 14A (a cross-sectional cut X-X') and FIG. 14B (a cross-sectional cut Y-Y'), the vias 1304, 1306 and 1308 are then filled with a via hardmask material 1402 to form the via hardmasks. Notably, the trenches 202 in between the metal lines 106 and the line cut trench 204 in between the segments 106*a* and 106*b* have already been filled with via hardmask material 1202 to form the scaffolding (see above). According to an exemplary embodiment, the same material is used as via hardmask material 1202 and via hardmask material 1402, e.g., SiOx and/or SOG. In this embodiment, the via hardmask material 1402 to form the via hardmasks is being filled separately from the scaffolding. Thus, it is likely that the via hardmasks here will not be at the same height as the scaffolding. See, e.g., FIG. 14A and FIG. 14B. However, there could be topography around the metal lines in any of the embodiments provided herein.

Specifically, as shown in FIG. 14A the via hardmask material 1402 deposited into the vias 1304 and 1306 is present over the metal lines 106/metal line segment 106*b* and will serve as the via hardmasks (via HM). Similarly, as shown in FIG. 14B the via hardmask material 1402 deposited into the vias 1306 and 1308 is present over the metal line segment 106*b* and will also serve as the via hardmasks. Advantageously, the scaffolding adjacent to the via hardmasks physically supports the via hardmasks, preventing collapse of the via hardmasks during top via patterning.

Figure 15:
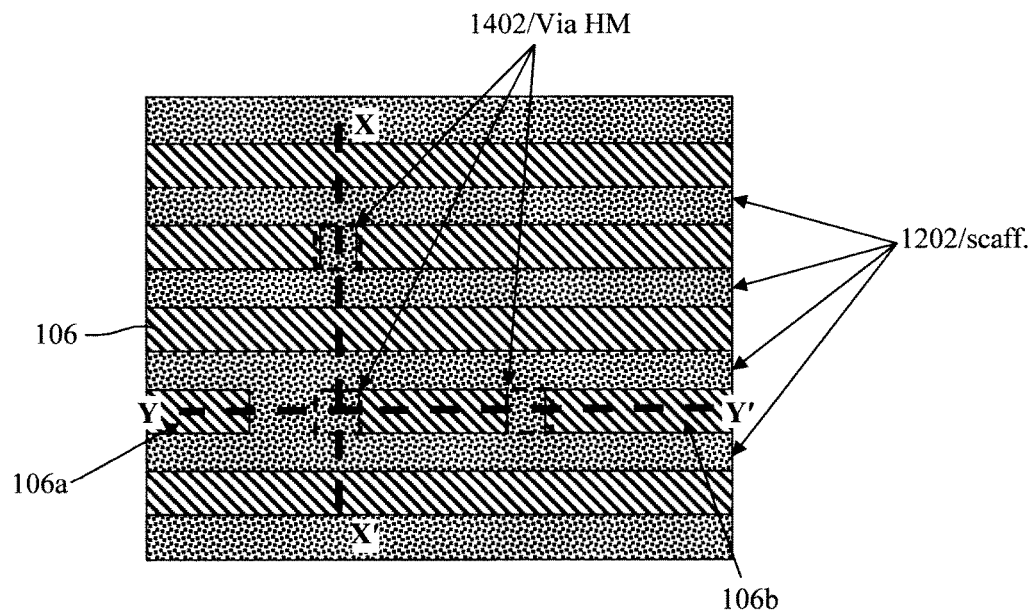
FIG. 15 is a top-down diagram illustrating the line hardmasks having been selectively removed according to an embodiment of the present invention.

The line hardmasks 104/line hardmask segments 104*a* and 104*b* are then removed selective to the via hardmask material 1202/1402, e.g., using a non-directional (isotropic) etching process such as a wet chemical etch. See FIG. 15 (a top-down view). As shown in FIG. 15, the via hardmasks are supported on at least two sides by the adjacent scaffolding.

Figure 16A:
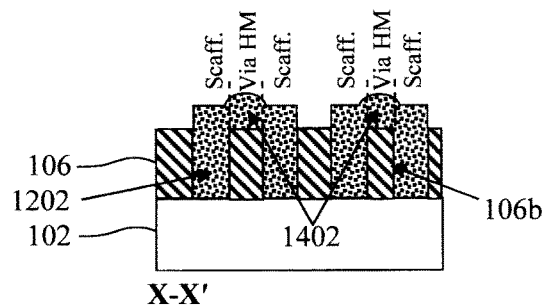
FIG. 16A is a cross-sectional diagram, perpendicular to the metal lines, illustrating the line hardmasks having been selectively removed.
Figure 16B:
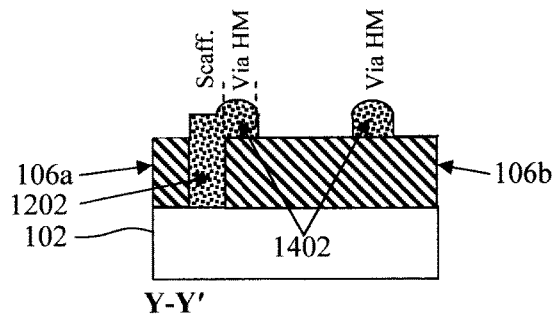
FIG. 16B is a cross-sectional diagram, through one of the metal lines, illustrating the line hardmasks having been selectively removed according to an embodiment of the present invention.

FIG. 16A (a cross-sectional cut X-X') and FIG. 16B (a cross-sectional cut Y-Y') illustrate the line hardmasks 104/line hardmask segments 104*a* and 104*b* having been selectively removed. As shown in FIG. 16A and FIG. 16B, the via hardmasks over the metal lines 106/metal line segment 106*b* are supported on at least two sides by the adjacent scaffolding.

Figure 17A:
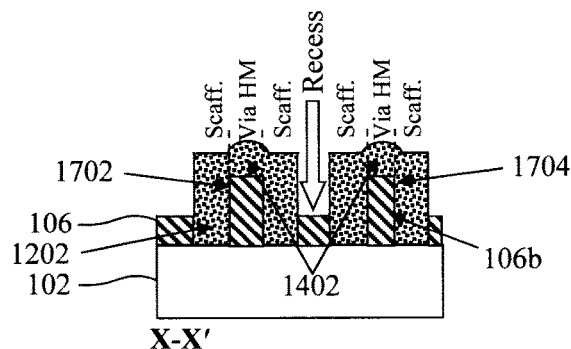
FIG. 17A is a cross-sectional diagram, perpendicular to the metal lines, illustrating an etch having been employed to recess the metal lines/metal line segments using the via hardmasks to form subtractive top vias self-aligned with the metal lines/metal line segments.
Figure 17B:
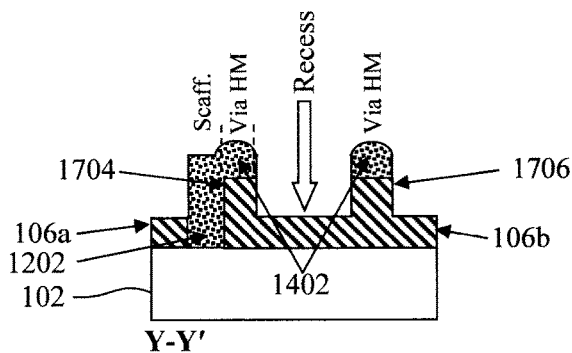
FIG. 17B is a cross-sectional diagram, through one of the metal lines, illustrating the etch having been employed to recess the metal lines/metal line segments using the via hardmasks to form subtractive top vias self-aligned with the metal lines/metal line segments according to an embodiment of the present invention.

With the via hardmasks (and supporting scaffolding) in place marking the footprint and location of the top vias, an etch is then employed to recess the metal lines 106/metal line segments 106*a* and 106*b*. See FIG. 17A (a cross-sectional cut X-X') and FIG. 17B (a cross-sectional cut Y-Y'). As shown in FIG. 17A and FIG. 17B, this recess etch forms subtractive top vias 1702, 1704 and 1706 in metal lines 106/metal line segment 106*b*.

Figure 18:
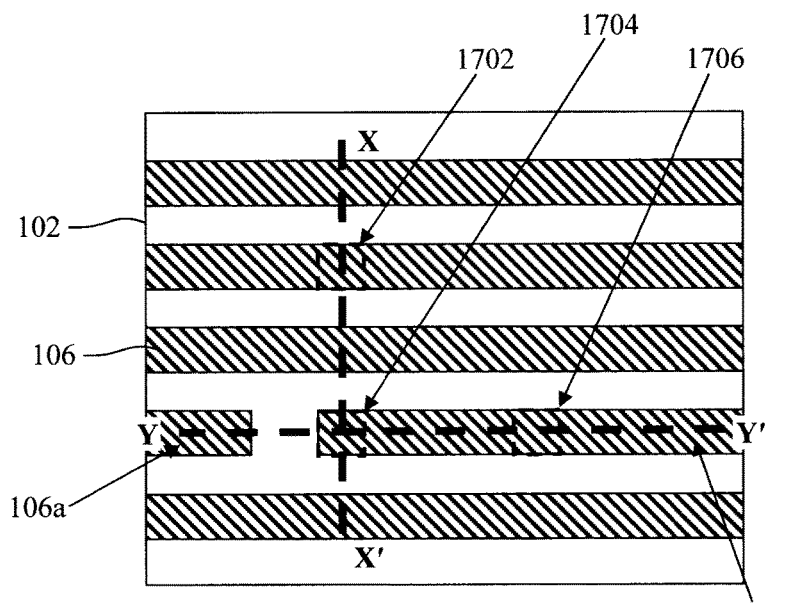
FIG. 18 is a top-down diagram illustrating the via hardmasks and scaffolding having been removed according to an embodiment of the present invention.

Following formation of top vias 1702, 1704 and 1706 in metal lines 106/metal line segment 106*b*, the via hardmasks and scaffolding (i.e., via hardmask material 1202/1402) is then removed. See FIG. 18 (a top-down view). As provided above, the via hardmask material 1202/1402 can be removed using a non-directional (isotropic) etching process such as a wet chemical etch. As shown in FIG. 18, top vias 1702, 1704 and 1706 are now present over select metal lines 106. Notably, by way of the present process, the top vias 1702, 1704 and 1706 are self-aligned with the underlying metal lines 106, including top via 1704 that is self-aligned with the end of metal line segment 106*b*.

Figure 19A:
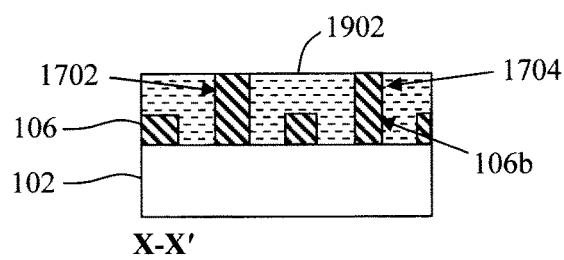
FIG. 19A is a cross-sectional diagram, perpendicular to the metal lines, illustrating the via hardmasks and scaffolding having been removed, and the top vias and metal lines/metal line segments having been buried in an ILD which is then polished down to (and exposing) the tops of the top vias.
Figure 19B:
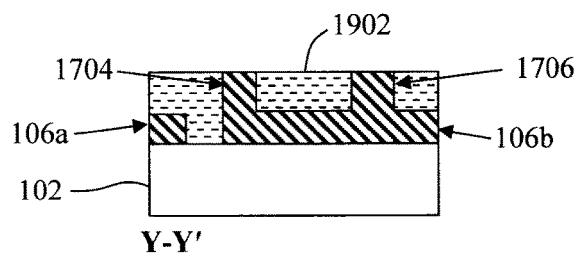
FIG. 19B is a cross-sectional diagram, through one of the metal lines, illustrating the via hardmasks and scaffolding having been removed, and the top vias and metal lines/metal line segments having been buried in the ILD which is then polished down to (and exposing) the tops of the top vias according to an embodiment of the present invention.

FIG. 19A (a cross-sectional cut X-X') and FIG. 19B (a cross-sectional cut Y-Y') illustrate the via hardmasks and scaffolding (i.e., via hardmask material 402) having been selectively removed, and the top vias 1702, 1704 and 1706, and metal lines 106/metal line segments 106*a* and 106*b* having been buried in an ILD 1902. As shown in FIG. 19A and FIG. 19B, the top vias 1702, 1704 and 1706 formed by the present process are self-aligned with the underlying metal lines 106, including top via 1704 that is self-aligned with the end of metal line segment 106*b*.

As provided above, suitable ILD 1902 materials include, but are not limited to, SiOx and/or oxide ULK-ILD materials such as pSiCOH. As shown in FIG. 19A and FIG. 19B, following deposition the ILD 1902 can be planarized using a process such as CMP. According to an exemplary embodiment, the ILD 1902 is polished down to (and exposing) the tops of the top vias 1702, 1704 and 1706.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming top vias, the method comprising the steps of:
    forming metal lines on a substrate using line hardmasks;
    patterning vias in the line hardmasks;
    filling the vias and trenches in between the metal lines with a via hardmask material, wherein the via hardmask material filling the vias comprises via hardmasks, and wherein the via hardmask material filling the trenches in between the metal lines comprises a scaffolding adjacent to and supporting the via hardmasks;
    removing the line hardmasks; and
    recessing the metal lines using the via hardmasks to form the top vias that are self-aligned with the metal lines.

2. The method of claim 1, further comprising the step of:
    removing the via hardmasks and the scaffolding.

3. The method of claim 1, wherein the metal lines comprise a metal selected from the group consisting of: cobalt (Co), ruthenium (Ru), tungsten (W), and combinations thereof.

4. The method of claim 1, wherein the line hardmasks comprise a material selected from the group consisting of: silicon nitride (SiN), silicon oxynitride (SiON), silicon carbide nitride (SiCN), silicon oxide (SiOx), and combinations thereof.

5. The method of claim 1, further comprising the steps of:
    depositing an organic planarizing layer (OPL) onto the line hardmasks and the metal lines, and filling the trenches in between the metal lines;
    patterning the vias in the OPL and in the line hardmasks; and
    removing the OPL.

6. The method of claim 1, wherein the via hardmask material is selected from the group consisting of: SiOx, spin-on-glass, and combinations thereof.

7. The method of claim 1, further comprising the steps of:
    burying the metal lines in an interlayer dielectric (ILD); and
    polishing the ILD to expose a top of the top vias.

8. The method of claim 1, further comprising the steps of:
    cutting at least one of the metal lines into segments with a line cut trench in between the segments; and
    filling the vias, the trenches in between the metal lines, and the line cut trench with the via hardmask material.

9. The method of claim 8, wherein at least one of the top vias is self-aligned with an end of at least one of the segments.

10. A method of forming top vias, the method comprising the steps of:
    forming metal lines on a substrate using line hardmasks;
    filling trenches in between the metal lines with a via hardmask material;
    patterning vias in the line hardmasks;
    filling the vias with the via hardmask material, wherein the via hardmask material filling the vias comprises via hardmasks, and wherein the via hardmask material filling the trenches in between the metal lines comprises a scaffolding adjacent to and supporting the via hardmasks;
    removing the line hardmasks; and recessing the metal lines using the via hardmasks to form the top vias that are self-aligned with the metal lines.

11. The method of claim 10, further comprising the step of:
    removing the via hardmasks and the scaffolding.

12. The method of claim 10, wherein the metal lines comprise a metal selected from the group consisting of: Co, Ru, W, and combinations thereof.

13. The method of claim 10, wherein the line hardmasks comprise a material selected from the group consisting of: SiN, SiON, SiCN, SiOx, and combinations thereof.

14. The method of claim 10, further comprising the steps of:
    depositing an OPL onto the line hardmasks and the metal lines over the scaffolding;
    patterning the vias in the OPL and in the line hardmasks; and
    removing the OPL.

15. The method of claim 10, wherein the via hardmask material is selected from the group consisting of: SiOx, spin-on-glass, and combinations thereof.

16. The method of claim 10, further comprising the steps of:
    burying the metal lines in an ILD; and
    polishing the ILD to expose a top of the top vias.

17. The method of claim 10, further comprising the steps of:
    cutting at least one of the metal lines into segments with a line cut trench in between the segments; and
    filling the vias, the trenches in between the metal lines, and the line cut trench with the via hardmask material.

18. A structure, comprising:
    metal lines formed on a substrate;
    top vias self-aligned with the metal lines;
    via hardmasks disposed on the top vias; and
    a scaffolding, disposed in trenches between the metal lines, adjacent to and supporting the via hardmasks.

19. The structure of claim 18, wherein via hardmasks and the scaffolding are formed from a via hardmask material selected from the group consisting of: SiOx, spin-on-glass, and combinations thereof.

20. The structure of claim 18, further comprising:
    an ILD surrounding the metal lines and the top vias.

* * * * *